United States Patent [19]
Kasahara et al.

[11] Patent Number: 5,084,748
[45] Date of Patent: Jan. 28, 1992

[54] SEMICONDUCTOR OPTICAL MEMORY HAVING A LOW SWITCHING VOLTAGE

[75] Inventors: Kenichi Kasahara; Ichiro Ogura; Yoshiharu Tashiro; Mitsunori Sugimoto, all of Tokyo, Japan

[73] Assignee: NEC Corporation, Tokyo, Japan

[21] Appl. No.: 676,476

[22] Filed: Mar. 27, 1991

Related U.S. Application Data

[63] Continuation of Ser. No. 447,483, Dec. 7, 1989, abandoned.

[30] Foreign Application Priority Data

Dec. 7, 1988 [JP] Japan .................. 63-310361

[51] Int. Cl.$^5$ .................. H01L 27/14; H01L 31/00; H01L 33/00
[52] U.S. Cl. .................. 357/30; 357/17; 357/16; 357/38
[58] Field of Search .............. 357/30 B, 30 E, 30 F, 357/30, 17, 16, 38

[56] References Cited

U.S. PATENT DOCUMENTS

| | | | |
|---|---|---|---|
| 4,122,407 | 10/1978 | Van Vechten | 331/94.5 |
| 4,301,463 | 11/1981 | Barrus, Jr. et al. | 357/30 |
| 4,819,048 | 4/1989 | Mand et al. | 357/17 |

OTHER PUBLICATIONS

Kasahara et al., 'Double Heterostructure ... Switch ...', Appl Phys Letts 52(9), 29 Feb. 88.
Taylor et al, "A New Double Heterostructure Optoelectronic Switching Device Using Molecular Beam Epitaxy", J. Appl. Phys. 59(2), 15 Jan. 1986, pp. 596-600.

Primary Examiner—Andrew J. James
Assistant Examiner—Stephen D. Meier
Attorney, Agent, or Firm—Sughrue, Mion, Zinn, Macpeak & Seas

[57] ABSTRACT

A semiconductor optical memory includes a gate layer composed of a p- first semiconductor layer, a p- or n- second semiconductor layer, and an n- third semiconductor layer provided between a cathode layer and an anode layer. Where the second layer is of n- type, an impurity concentration of the n- second semiconductor layer is lower than an impurity concentration of the n- third semiconductor layer, and a bandgap eneray of the n- third semiconductor layer is lower than bandgap energies of the cathode and anode layers. Where the second layer is of p- type, an impurity concentration of the p- second semiconductor layer is lower than an impurity concentration of the p- first semiconductor layer, and a bandgap energy of the p- first semiconductor layer is lower than bandgap energies of the cathode and anode layers. As a result, a response speed becomes as fast as several 100 Mb/s.

2 Claims, 5 Drawing Sheets

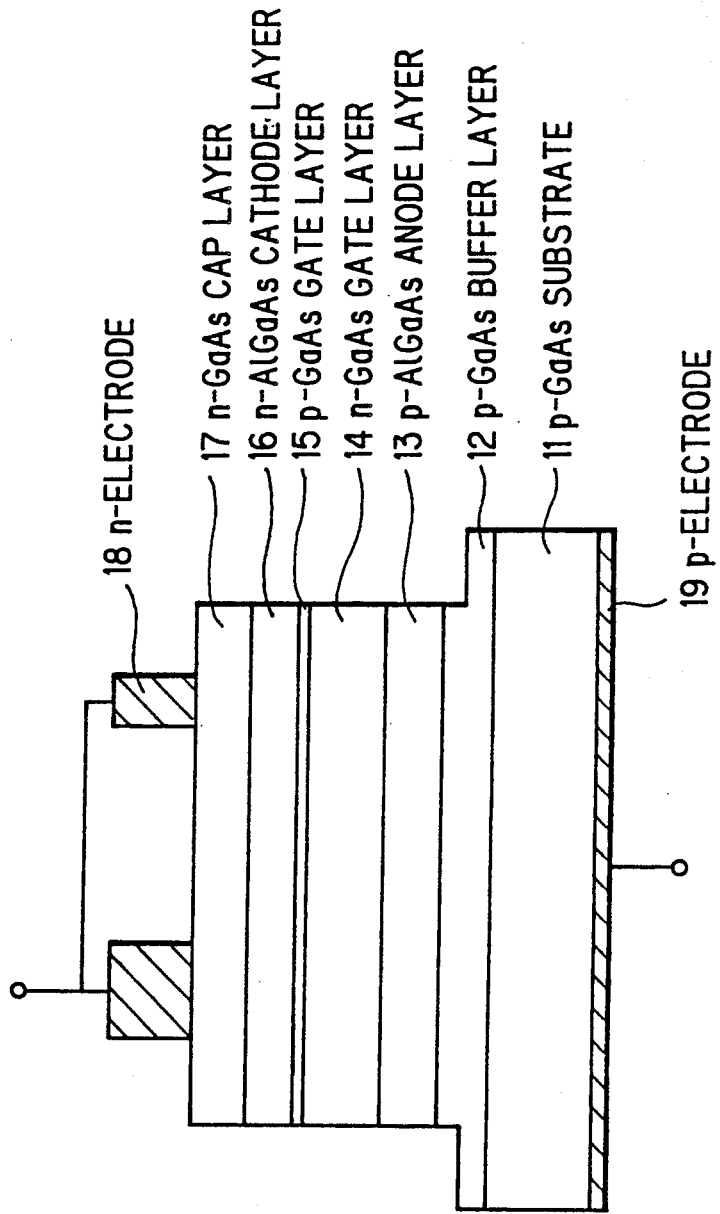

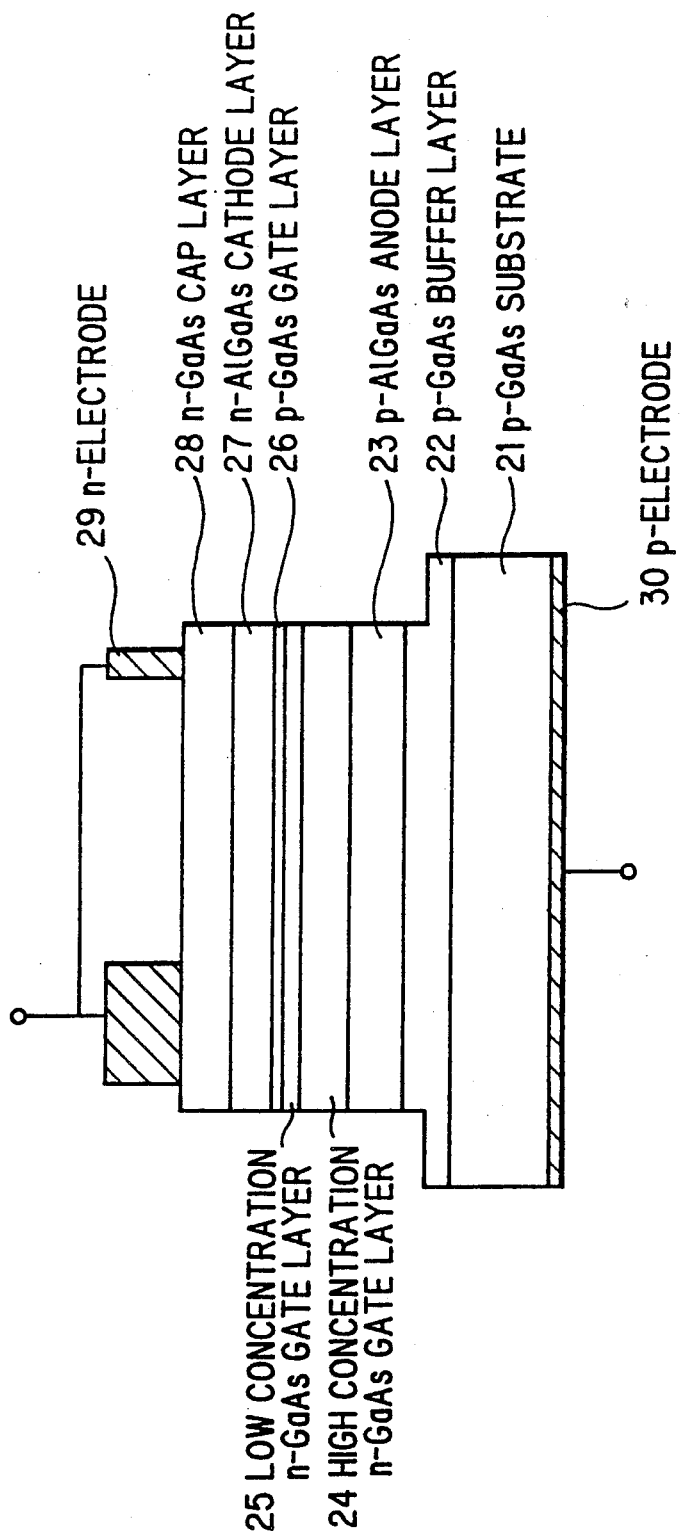

SEMICONDUCTOR OPTICAL MEMORY HAVING A LOW SWITCHING VOLTAGE

This is a continuation of application Ser. No. 07/447,483 filed Dec. 7, 1989, now abandoned.

FIELD OF THE INVENTION

This invention relates to a semiconductor optical memory, and more particularly, to a semiconductor optical memory which is utilized in image processing systems, optical computers, and the like.

BACKGROUND OF THE INVENTION

A semiconductor optical memory which is turned on by a minute trigger light and remains to emit an output light, even after the trigger light ceases is an important key device in image processing systems, optical computers, and the like. Such a semiconductor optical memory has been described on pages 596 to 600 of "J. Appl. Phys. 59(2), Jan. 15, 1986". The semiconductor optical memory comprises a p-GaAs substrate, and a buffer layer of p-GaAs having a thickness of 0.3 $\mu$m, an anode layer of p-AlGaAs having a thickness of 0.5 $\mu$m, an n-gate layer of n-GaAs having a thickness of 1 $\mu$m, a p-gate layer of p-GaAs having a thickness of 50 Å, a cathode layer of n-AlGaAs having a thickness of 1 $\mu$m, and a cap layer of n-GaAs having a thickness of 0.5 $\mu$m grown successively on the first surface of the p-GaAs substrate. The semiconductor optical memory further comprises a p-electrode provided on the second surface of the p-GaAs substrate, and an n-electrode provided on the cap layer.

In operation, where a voltage which is applied across the p-and n-electrodes of the semiconductor optical memory in the forward direction is increased without a trigger light supplied thereto, the semiconductor optical memory is turned on at a predetermined voltage which is defined as a switching voltage. Then, an output light is emitted from the semiconductor optical memory which is shifted from a high impedance state to a low impedance state. In the low impedance state, carriers are injected into the n-gate layer, so that the carriers are confined in a potential barrier defined by the anode and cathode layers having large bandgap energies. This results in a light emission with a high efficiency. In this circumstance, the carriers are mainly confined in the n-gate layer of a larger thickness, and light is also confined dominantly in the n-gate layer in AlGaAs/GaAs system semiconductor memory, because AlGaAs is lower in refractive index due to the inclusion of Al. Even if the applied voltage is decreased below the switching voltage, the low impedance state is held, unless the applied voltage is decreased below a holding voltage.

On the other hand, a trigger light having a predetermined level is supplied to the semiconductor optical memory which is thereby turned on to emit an output light continuously, where a bias voltage which is lower than the switching voltage by a predetermined small voltage is applied across the p-and n-electrodes of the semiconductor optical memory. This is a function of an optical memory. The trigger light is mainly absorbed in the n-gate layer, wherein a wavelength of the trigger light must be shorter than a wavelenghth of GaAs bandgap.

In the above described semiconductor optical memory, a carrier concentiation of the p-gate layer is $1 \times 10^{19} \text{cm}^{-3}$, and that of the n-gate layer is $1 \times 10^{17} \text{cm}^{-3}$. Where a voltage applied across the p-and n-electrodes is increased in the forward direction in the high impedance state, a reverse bias voltage is applied across the p-and n-gate layers, so that a depletion layer is extended dominantly into the n-gate layer having the lower carrier concentration. In this circumstance, when the applied voltage is increased to be the switching voltage, an avalanche breakdown occurs in the depletion layer, so that the semiconductor optical memory is turned on to be in the low impedance state. Generally, an electric field strength, under which an avalanche breakdown occurs, is reversely proportional to an exponent of "$\frac{1}{4}$" relative to an impurity concentration of a lower concentration layer which is included in a pn junction of one-side step type composed of p-and n-layers of first and second uniform impurity concentrations having a sufficient concentration difference therebetween.

In a practical use, it is preferable to set a switching voltage to be 4 V. For this purpose, it is required to set a carrier concentration of the n-gate layer to be $1 \times 10^{17} \text{cm}^{-3}$, wherein a spontaneous emission life time $\tau$ is obtained to be 100 ns ($\tau = 100$ ns). An operation speed of the semiconductor optical memory is determined by the spontaneous emission life time $\tau$. Where a rise time and a fall time of an emitted light are 100 ns, respectively, the semiconductor optical memory can operate at the maximum frequency of 10 MHz.

However, the semiconductor optical memory has a disadvantage in that it can not be used in a response speed of several 100 Mb/s by use of a practical switching voltage. As described above, the spontaneous emission life time $\tau$ is preferable short, thereby increasing a response speed. The life time $\tau$ becomes short, as the carrier concentration of the n-gate layer is increased. it is very difficult for the carrier concentration of the n-gate layer to be larger than the aforementioned value, because a current-voltage characteristic which is inherent to a pnpn structure is no longer obtained, if it is assumed that the carrier concentration is $1 \times 10^{18} \text{cm}^{-3}$ which is ten times the aforementioned value. As a result of this increase of the carrier concentration, a switching voltage is lowered to be less than a holding voltage which is equal to or less than approximately 1.6 V. For this reason, no semiconductor optical memory which can operate in a response speed of several 100 Mb/s with a practical switching voltage has been proposed.

SUMMARY OF THE INVENTION

Accordingly, it is an object of this invention to provide a semiconductor optical memory which operates at a high response speed, as fast as several 100 Mb/s with a practical switching voltage.

According to this invention, a semiconductor optical memory comprises an n-cathode layer, a p-first semiconductor layer, a second semiconductor layer of one conduction type selected from p-and n-types, an n-third semiconductor layer, and a p-anode layer. Where the second semiconductor layer is of n-type, an impurity concentration of the second semiconductor layer is lower than that of the third semiconductor layer, and a bandgap energy of the third semiconductor layer is lower than bandgap energies of the anode layer and the cathode layers. On the other hand, where the second semiconductor layer is of p-type, the impurity concentration of the second semiconductor layer is lower than that of the first semiconductor layer, and a bandgap energy of the first semiconductor layer is lower than the bandgap energies of the anode layer and the cathode layer.

BRIEF DESCRIPT DRAWINGS

This invention will be explained in more detail in conjunction with appended drawings, wherein:

FIG. 1 is a schematic cross-sectional view showing a conventional semiconductor optical memory, FIGS. 2A and 2B are a schematic cross-sectional view and a plan view showing a semiconductor optical memory in a preferred embodiment according to the invention, and FIGS. 3A and 3B are explanatory diagrams, respectively, showing an avalanche breakdown voltage and a spontaneous emission life time relative to a carrier concentration.

DESCRIPTION OF THE PREFERRED EMBODIMENT

Figure 2B:
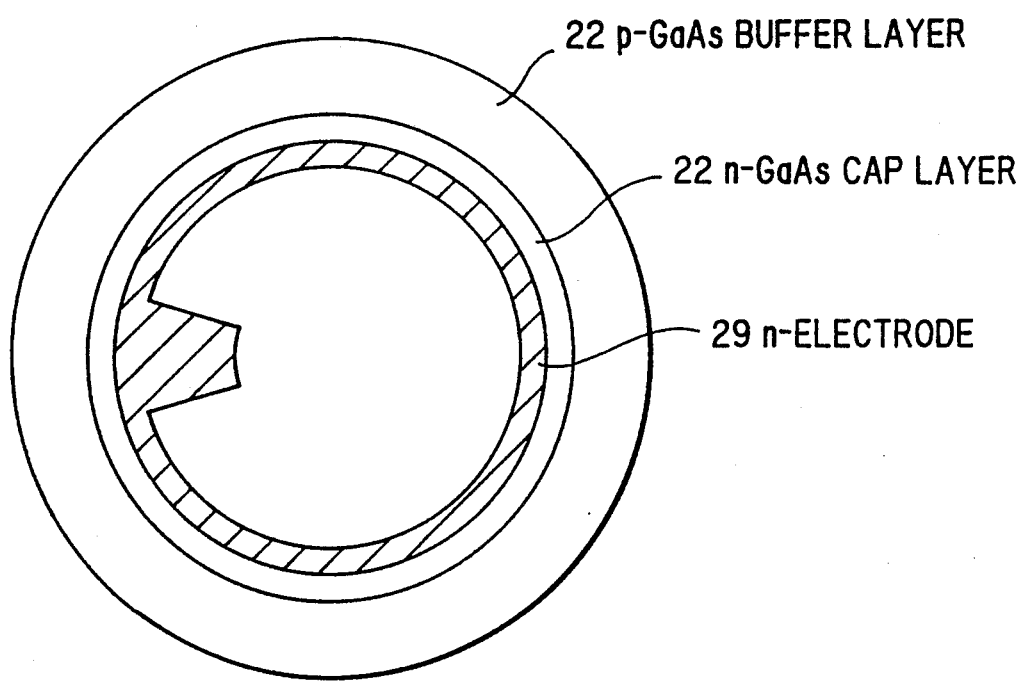

Before explaining a semiconductor optical memory in the preferred embodiment according the invention, the aforementioned conventional semiconductor optical memory will be explained with reference to FIG. 1. The semiconductor optical memory comprises a p-GaAs substrate 11, a buffer layer 12 of p-GaAs having a thickness of 0.3 $\mu$m, an anode layer 13 of p-AlGaAs having a thickness of 0.5 $\mu$m, an n-gate layer 14 of n-GaAs having a thickness of 1 $\mu$m, a p-gate layer 15 of p-GaAs having a thickness of 50 Å, a cathode layer 16 of n-AlGaAs having a thickness of 1 $\mu$m, and a cap layer 17 of n-GaAs having a thickness of 0.5 $\mu$m. The semiconductor optical memory further comprises an n-electrode 18 provided on the top surface of the cap layer 17, a p-electrode 19 provided on the bottom surface of the substrate 11. Operation of the semiconduct optical memory will not be explained here, because it was explained before.

FIGS. 2A and 2B show a semiconductor optical memory in the preferred embodiment which is fabricated by use of GaAs system semiconductor and applied to a wavelength band of 0.8 $\mu$m. The semiconductor optical memory comprises a p-GaAs substrate 21, and a buffer layer 22 of p-GaAs having a thickness of 0.3 $\mu$m and a carrier concentration of $2 \times 10^{18}$ cm$^{-3}$ doped with Be, an anode layer 23 of p-Al$_{0.4}$Ga$_{0.6}$As having a thickness of 0.5 $\mu$m and a carrier concentration of $2 \times 10^{18}$ cm$^{-3}$ doped with Be, a high concentration n-gate layer 24 of n-GaAs having a thickness of 0.7 $\mu$m and a carrier concentration of $5 \times 10^{18}$ cm$^{-3}$ doped with Si and functioning as a light absorbing and emitting layer, a low concentration n-gate layer 25 of n-GaAs having a thickness of 0.3 $\mu$m and a carrier concentration of $1 \times 10^{17}$ cm$^{-3}$ doped with Si and functioning as a switching voltage setting layer, a p-gate layer 26 of p-GaAs having a thickness of 50 Å and a carrier concentration of $1 \times 10^{19}$ cm$^{-3}$ doped with Be, a cathode layer 27 of n-Al$_{0.4}$Ga$_{0.6}$As having a thickness of 400 Å and a carrier concentration of $2 \times 10^{18}$ cm$^{-3}$ doped with Si, and a cap layer 28 doped with Si successively grown on the substrate 21 by metal beam epitaxy (MBE). The semiconductor optical memory further comprises an n-electrode 29 provided on the top surface of the cap layer 28, and a p-electrode 30 provided on the bottom surface of the substrate 21. As clearly illustrated in FIG. 2B, the semiconductor optical memory is of a cylindrial shape, and a mesa diameter is 30 $\mu$m.

Even in a structure having an n-composite gate composed of the high concentration n-gate layer 24 and the low concentration n-gate layer 25, a switching voltage of 4 V is obtained. Even more, a rise time and fall time of an emitted light can be as short as 2 ns. In this case, a time which is approximately two times a carrier spontaneous life time is equal to a rise time and a fall time defined by 10% and 90% practically used. In this preferred embodiment, a thickness of the low concentration n-gate layer 25 is 0.3 $\mu$m. This thickness is larger than a length of a depletion layer extended toward the n-gate layer. For this reason, where the thickness is set to be 0.3 $\mu$m, no change occurs in the switching voltage. A total thickness of the n-gate layers 24 and 25 is 1 $\mu$m (=0.3 $\mu$+0.7 $\mu$m) in the preferred embodiment. An absorption factor of a trigger light is not largely decreased, if a total thickness is set to be the thickness.

In this preferred embodiment, p-and n-types may be exchanged in each layer to provide the same advantage, in the structure that the thickness and the carrier concentration of each layer is the same as described above. Further, GaAs/GaAs system material may be replaced by InGaAsP/InP system material, a combination of AlGaAs/GaAs and InGaAsP/InP system materials, and the like.

Figure 3A:
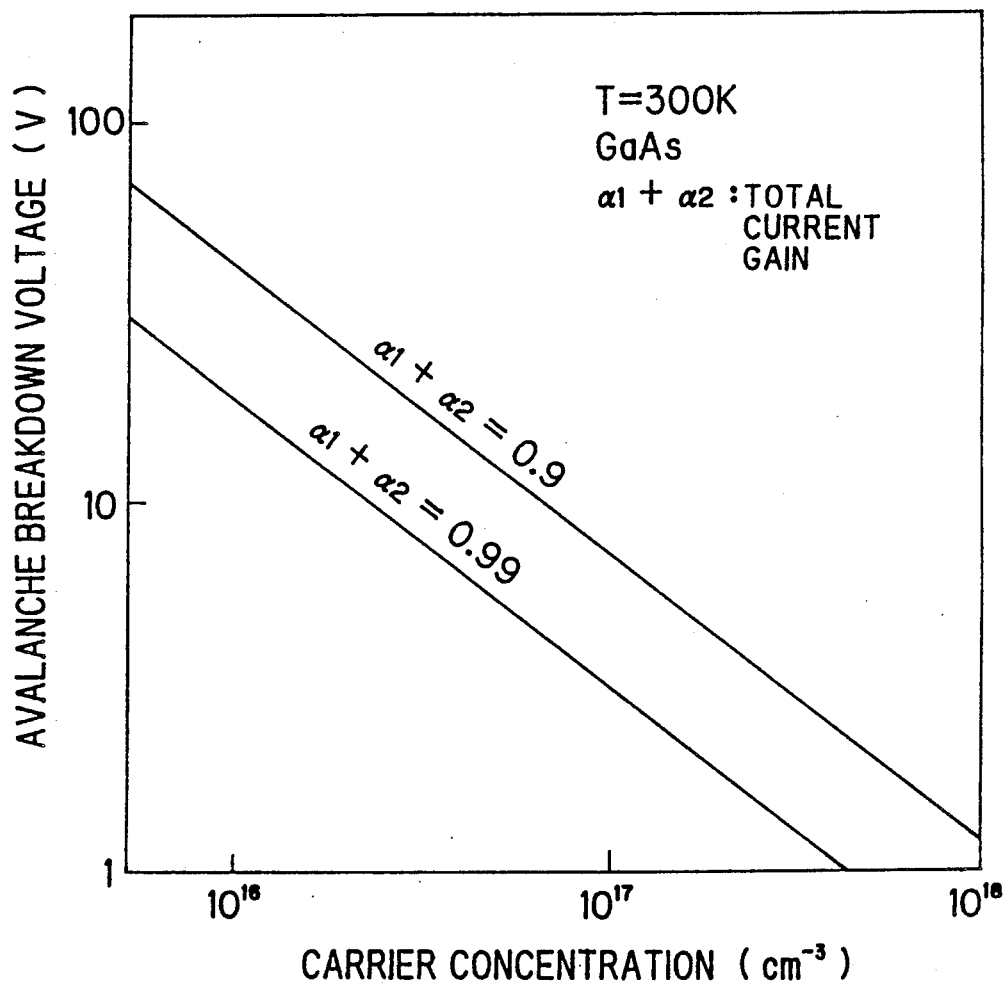
Figure 3B:
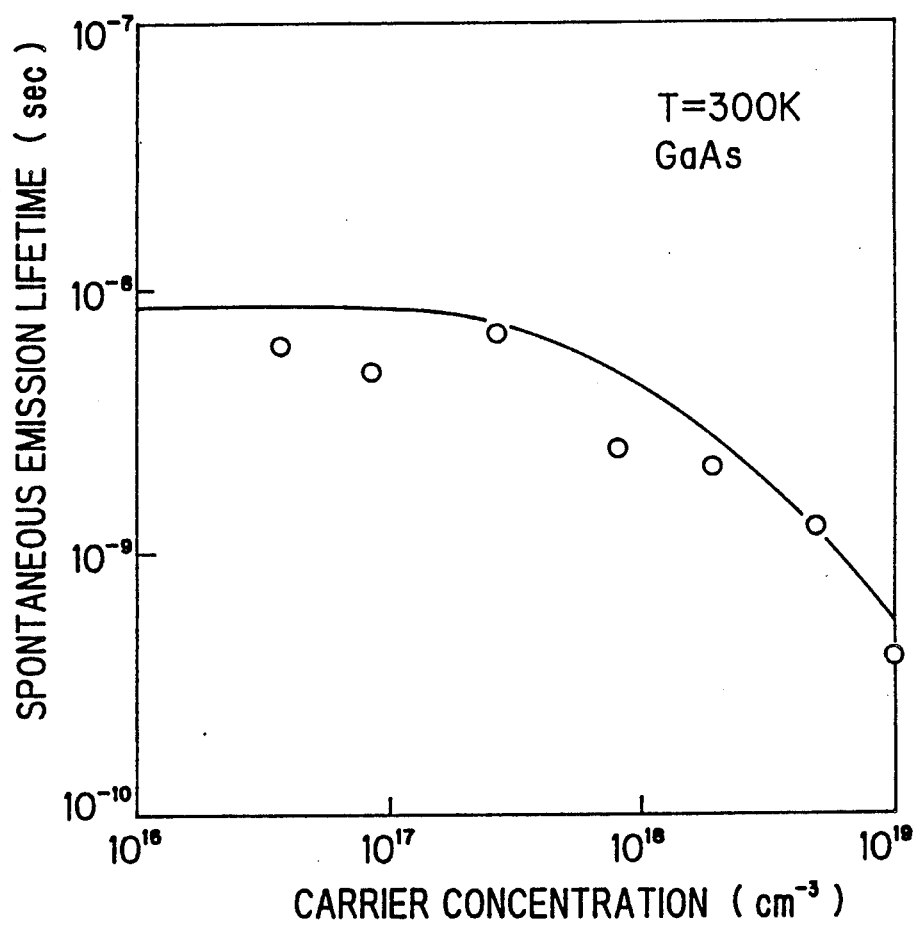

In operation and principle of this invention, an avalanche breakdown voltage is decreased, while a spontaneous emission life time $\tau$ is shortened to be faster, as a carrier concentration is increased, as shown in FIGS. 3A and 3B, wherein "T" is an absolute temperature, and "$\alpha_1 + \alpha_2$" is a total current gain. As explained above, the n-composite gate layer includes the high and low concentration n-gate layers, so that a switching voltage is determined by a carrier concentration of the low concentration n-gate layer, into which a depletion layer is extended. If it is assumed that carrier concentrations of the high and low n-gate layers are different from the other by one digit, the spontaneous emission life time is almost determined by the carrier concentration of the high concentration n-gate layer. As a result, the spontaneous emission life time r can be short to provide a high speed response. For this reason, the carrier concentrations of the high and low concentration n-gate layers 24 and 25 are set to be $1 \times 10^{17}$ cm$^{-3}$ and $1 \times 10^{19}$ cm$^{-3}$, respectively, in the preferred embodiment.

Although the invention has been described with respect to specific embodiment for complete and clear disclosure, the appended claims are not to be thus limited but are to be construed as embodying all modification and alternative construction that may occur to one skilled in the art which fairly fall within the basic teaching herein set forth.

What is claimed is:

1. A semiconductor optical memory, comprising:
   cathode and anode layers;
   a gate layer provided between said cathode and anode layers; and
   n and p electrodes for applying a predetermined voltage across said cathode and anode layers;
   wherein said gate layer includes:
   a p gate layer provided on a side of said cathode layer; and
   an n gate layer provided on a side of said anode layer; said n gate layer including a first layer of a first impurity concentration having a predetermined bandgap energy in contact with said p gate layer, and a second layer of a second impurity concentration and having said predetermined bandgap energy in non-contact with said p gate layer, said first impurity concentration being greater than $0.6 \times 10^{17} \text{cm}^{-3}$ and said second impurity concentration being greater than $1.0 \times 10^{18} \text{cm}^{-3}$, and said predetermined bandgap energy being lower than bandgap energies of said cathode and anode layers.

2. A semiconductor optical memory comprising:

cathode and anode layers;

a gate layer provided between said cathode and anode layers; and n and p electrodes for applying a predetermined voltage across said cathode and anode layers;

wherein said gate layer includes:

a p gate layer provided on a side of said cathode layer; and an n gate layer provided on a side of said anode layer; said p gate layer including a first layer of a first impurity concentration having a predetermined bandgap energy in contact with said n gate layer, and a second layer of a second impurity concentration and having said predetermined bandgap energy in non-contact with said n gate layer, said first impurity concentration being greater than $0.6 \times 10^{17} \text{cm}^{-3}$ and said second impurity concentration being greater than $1.0 \times 10^{18} \text{cm}^{-3}$, and said predetermined bandgap energy being lower than bandgap energies of said cathode and anode layers.

* * * * *

UNITED STATES PATENT AND TRADEMARK OFFICE
CERTIFICATE OF CORRECTION

PATENT NO. : 5,084,748

DATED : January 28, 1992

INVENTOR(S) : Kenichi KASAHARA, Ichiro OGURA, Yoshiharu TASHIRO and Mitsunori SUGIMOTO It is certified that error appears in the above-identified patent and that said Letters Patent is hereby corrected as shown below:

Col. 4, line 22, after "Further," and insert --Al--;

Col. 4, line 41, delete "r" and insert --τ--

Signed and Sealed this

Twenty-seventh Day of April, 1993

Attest:

MICHAEL K. KIRK

Attesting Officer     Acting Commissioner of Patents and Trademarks